US007858898B2

(12) United States Patent
Bailey, III et al.

(10) Patent No.: US 7,858,898 B2
(45) Date of Patent: Dec. 28, 2010

(54) BEVEL ETCHER WITH GAP CONTROL

(75) Inventors: Andrew D. Bailey, III, Pleasanton, CA (US); Alan M. Schoepp, Ben Lomond, CA (US); Gregory Sexton, Fremont, CA (US); Andras Kuthi, Thousand Oaks, CA (US); Yunsang Kim, Monte Sereno, CA (US); William S. Kennedy, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1007 days.

(21) Appl. No.: 11/698,191

(22) Filed: Jan. 26, 2007

(65) Prior Publication Data

US 2008/0179297 A1 Jul. 31, 2008

(51) Int. Cl.
*B23K 10/00* (2006.01)
(52) U.S. Cl. .............................. 219/121.4; 219/121.43; 219/121.44; 118/723 I; 156/345.51; 156/345.47
(58) Field of Classification Search ............. 219/121.4, 219/121.41, 121.43, 121.52, 158, 159; 118/723 R, 118/723 MW, 729, 723 I; 156/345.23, 345.34, 156/345.47, 345.51; 315/111.21, 111.51
See application file for complete search history.

(56) References Cited

U.S. PATENT DOCUMENTS

| | | | |
|---|---|---|---|
| 4,875,989 A | 10/1989 | Davis et al. | |
| 4,899,195 A | 2/1990 | Gotoh | |
| 5,213,650 A | 5/1993 | Wang et al. | |
| 5,425,846 A | 6/1995 | Koze et al. | |
| 5,945,351 A | 8/1999 | Mathuni | |
| 6,004,631 A | 12/1999 | Mori | |
| 6,241,825 B1 * | 6/2001 | Wytman | ..................... 118/733 |
| 6,406,589 B1 | 6/2002 | Yanagisawa | |
| 6,436,303 B1 | 8/2002 | Kim et al. | |
| 6,837,963 B2 | 1/2005 | Tanaka et al. | |
| 6,837,967 B1 | 1/2005 | Berman et al. | |
| 7,695,590 B2 * | 4/2010 | Hanawa et al. | .......... 156/345.39 |
| 2003/0029570 A1 * | 2/2003 | Kawamura et al. | ...... 156/345.51 |
| 2004/0137745 A1 | 7/2004 | Houghton et al. | |

(Continued)

FOREIGN PATENT DOCUMENTS

JP    02-192717    7/1990

(Continued)

OTHER PUBLICATIONS

International Search Report and Written Opinion dated Apr. 29, 2008 for PCT/US2008/000940.

*Primary Examiner*—Mark H Paschall
(74) *Attorney, Agent, or Firm*—Buchanan Ingersoll & Rooney PC

(57) ABSTRACT

A device for cleaning a bevel edge of a semiconductor substrate. The device includes a lower electrode assembly that has a top surface and is adapted to support the substrate and an upper electrode assembly that has a bottom surface opposing the top surface. The lower and upper electrode assemblies generate plasma for cleaning the bevel edge of the substrate disposed between the top and bottom surfaces during operation. The device also includes a mechanism for suspending the upper electrode assembly over the lower support and adjusting the tilt angle and horizontal translation of the bottom surface relative to the top surface.

19 Claims, 7 Drawing Sheets

U.S. PATENT DOCUMENTS

| | | |
|---|---|---|
| 2004/0238488 A1 | 12/2004 | Choi et al. |
| 2005/0173067 A1 | 8/2005 | Lim |
| 2005/0178505 A1 | 8/2005 | Kim |

FOREIGN PATENT DOCUMENTS

| | | |
|---|---|---|
| JP | 05-082478 | 4/1993 |
| JP | 07-142449 | 6/1995 |
| KR | 10-2003-0002241 A | 1/2003 |
| KR | 10-2006-0016280 | 2/2006 |
| KR | 10-2006-0037819 A | 5/2006 |

* cited by examiner

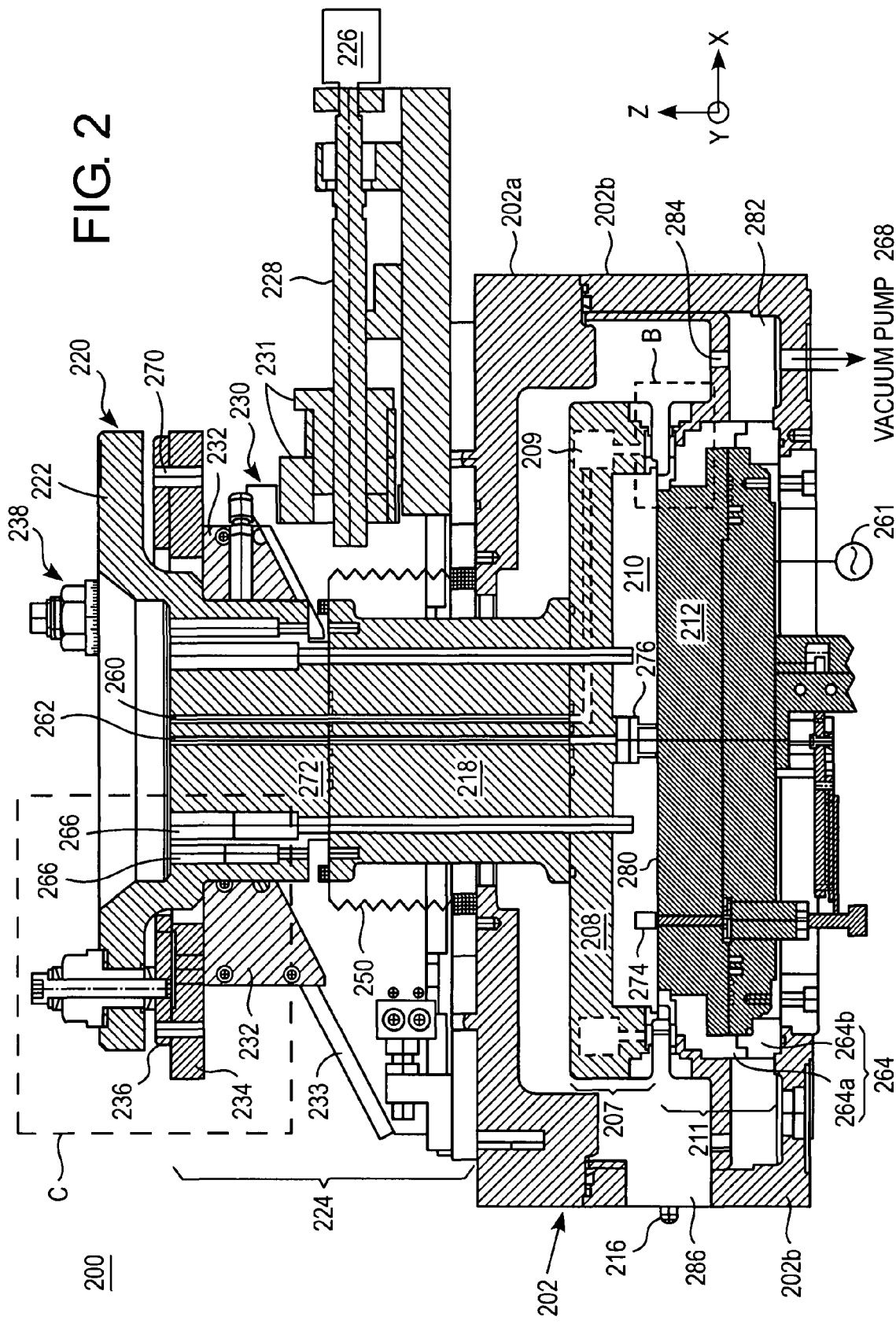

US 7,858,898 B2

BEVEL ETCHER WITH GAP CONTROL

BACKGROUND

Integrated circuits are formed from a wafer or substrate over which are formed patterned microelectronics layers. In the processing of the substrate, plasma is often employed to etch intended portions of films deposited on the substrate. Typically, etch plasma density is lower near the edge of the substrate, which may result in accumulation of a poly-silicon layer, a nitride layer, a metal layer, etc. (collectively referred to as byproduct layer) on the top and bottom surfaces of the substrate bevel edge. As successive byproduct layers are deposited on the top and bottom surfaces of the substrate bevel edge as a result of several different etch processes, the bonds between the byproduct layers and the substrate will eventually weaken and the byproduct layers may peel or flake off, often onto other substrates during substrate transport thereby contaminate the other substrates.

SUMMARY

In an embodiment, a bevel etcher for plasma cleaning a semiconductor substrate comprises a chamber having an interior in which a bevel edge of a semiconductor is plasma cleaned, a lower electrode assembly having a top surface and adapted to support a substrate having a bevel edge, an upper electrode assembly including a bottom surface that opposes and is in a spaced-apart relationship with the top surface to form a gap for receiving the substrate therein, the lower and upper electrode assemblies being operative to generate plasma for cleaning the bevel edge during operation, and at least one mechanism supporting the upper and/or lower electrode assemblies and adapted to adjust the tilt angle and/or horizontal translation of the bottom surface relative to top surface.

In another embodiment, a method for assembling the bevel etcher described above includes a plurality of leveling screws, comprises leveling the lower electrode assembly, disposing the upper electrode assembly over the lower electrode assembly, securing the mechanism to the upper electrode assembly, and rotating at least one of the leveling screws to adjust the tilt angle of the bottom surface relative to the top surface.

In another embodiment, a method of cleaning the bevel edge of a semiconductor substrate, comprises loading a semiconductor substrate in the bevel etcher described above, injecting process gas into the gap between the top and bottom surfaces, and energizing the process gas into the plasma to clean the bevel edge of the substrate.

BRIEF DESCRIPTION OF THE DRAWINGS

FIG. 2 shows a schematic cross sectional diagram of a bevel etcher in accordance with one embodiment.

DETAILED DESCRIPTION

Figure 1A:
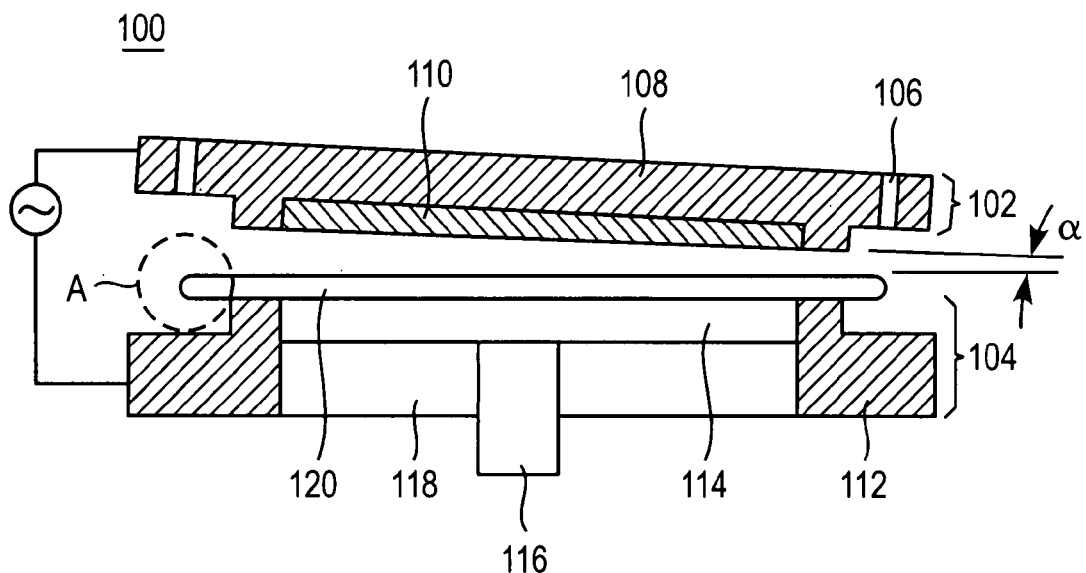
FIG. 1A shows a schematic cross sectional diagram of a bevel etcher.
Figure 1B:
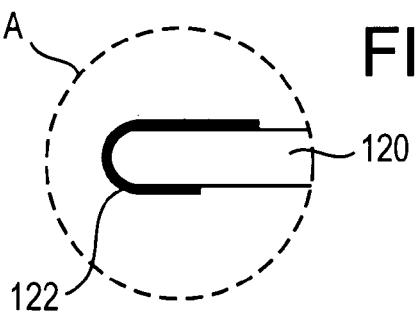
FIG. 1B shows an enlarged view of region A in FIG. 1A

FIG. 1A shows a schematic cross sectional diagram of a bevel etching chamber or bevel etcher 100. FIG. 1B shows an enlarged view of region A in FIG. 1A. As depicted, a semiconductor 120 is interposed between an upper electrode assembly 102 and a lower electrode assembly 104, and has a bevel edge 122 (FIG. 1B) that includes top and bottom surfaces of the edge of the substrate. The upper electrode assembly 102 includes an anode 108 and an insulator layer or an insulator 110 deposited beneath or attached to the bottom surface of the anode 108. The insulator 110 obviates formation of an electric field or an electromagnetic field between the anode 108 and the central portion of the substrate 120 during etching the bevel edge 122. The lower electrode assembly 104 includes a cathode 112 coupled to a radio frequency (RF) power source, an electrostatic chuck 114 for holding the substrate 120, and a support 116 for supporting the electrostatic chuck 114. The RF power source provides RF power to energize process gas (injected through one or more outlets 106) into plasma thereby to clean the bevel edge 122.

The lower surface of the upper electrode assembly 102 may be tilted relative to the upper surface of the lower electrode assembly 104 by an angle α. Likewise, the opposed surfaces of the upper and lower electrodes may be tilted by another angle in a direction 90° from the plane of FIG. 1A. Hereinafter, the term tilt angle collectively refers to the two angles. Also, the term planarity adjustment refers to adjusting the tilt angle. The tilt angle may cause plasma non-uniformity in the circumferential direction of the substrate 120, which may yield non-uniform etching of the bevel edge.

Figure 1C:
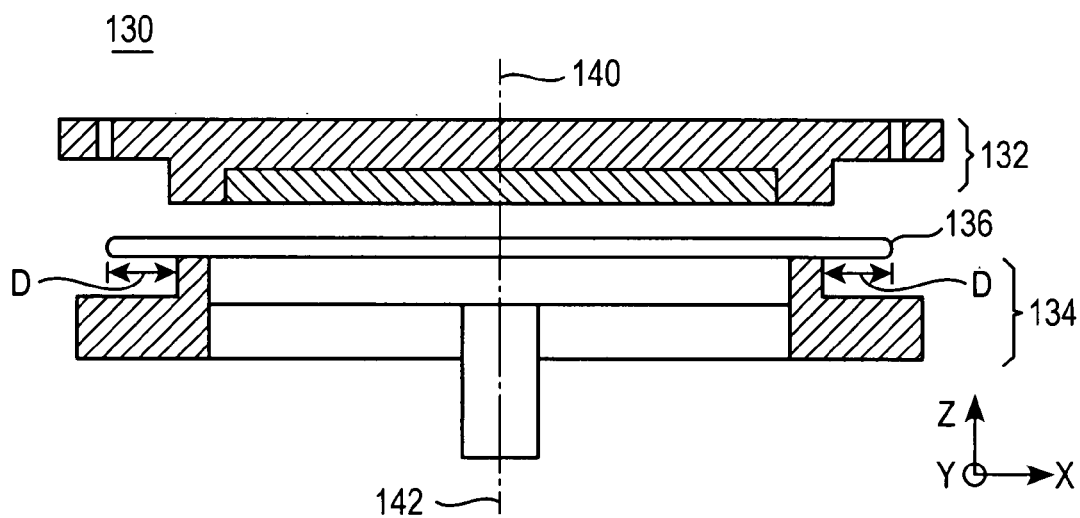
FIG. 1C shows a schematic cross sectional diagram of a bevel etcher.

FIG. 1C shows a schematic cross sectional diagram of a bevel etcher 130, wherein the lines 140, 142 respectively represent the center axes of the upper and lower electrode assemblies 132, 134. The components of the bevel etcher 130 are similar to those shown in FIG. 1A. As depicted, the upper electrode assembly 132 may be misaligned relative to the lower electrode assembly 134 in the x-direction. The upper electrode assembly 132 may also be misaligned relative to the lower electrode assembly 134 in the y-direction. Typically, the substrate 136 is aligned with one of the two electrode assemblies, preferably the upper electrode assembly 132. The axis misalignment may cause non-uniformity in the extent of the bottom edge exclusion zone D along the periphery of the substrate 136. In general, bevel etchers may have both the tilt angle and axis misalignment depicted in FIGS. 1A and 1C. Thus, there is a need for etching chambers that have mechanisms for planarity adjustment and axis alignment to generate uniform etching of the bevel edge.

Referring now to FIG. 2, there is shown a schematic cross sectional diagram of a substrate etching system or bevel etcher 200 for cleaning the bevel edge of a substrate 280 in accordance with one embodiment. The bevel etcher 200 includes: a lower electrode assembly 211; top and bottom chamber walls 202a, 202b that have a door or gate 216 through which the substrate 280 is loaded/unloaded; an upper electrode assembly 207 having a horizontally extending upper metal component 208 and an upper dielectric plate 210 attached to or secured in a recess in the upper metal component 208; a vertically extending upper electrode support 218 secured to the upper electrode assembly 207, preferably by fasteners (not shown in FIG. 2), and thereby suspending the upper electrode assembly 207 over the lower electrode assembly 211; an adjustment assembly 220 having a planarity plate 222, a plurality of screw assemblies 238, a cylindrical portion 272 secured between the plate 222 and the upper electrode support 218 by fasteners 266; an adapter plate 236 secured to the planarity plate 222 by the screw assemblies 238; a gap drive assembly 224 secured to the adapter plate 236 by fasteners 270; and metal bellows 250 for forming a vacuum seal between the chamber wall 202a and upper electrode support 218 while allowing the support 218 to have a vertical motion relative to the wall 202a.

The cylindrical portion 272, upper electrode support 218, and upper metal component 208 have a plurality of holes for receiving screws or fasteners 266 holding these components together. The upper dielectric plate 210 includes threaded holes for receiving the fasteners 266 so that the planarity adjustment assembly 220, upper electrode support 218, and upper metal component 208 are secured to the upper dielectric plate 210. For loading/unloading substrates through the gate 216, the gap drive assembly 224 moves the adapter plate 236, planarity adjustment assembly 220, upper electrode support 218 and the upper electrode assembly 207 as one piece in the vertical or z-direction. The cylindrical portion 272 and planarity plate 222 are preferably integrally formed as separate pieces or as a single body (e.g., a machined block of aluminum, aluminum alloy, steel or the like). In a variation, the planarity adjustment assembly 220 and upper electrode support 218 may be integrally formed as a single body (e.g., a machined block of aluminum, aluminum alloy, steel or the like). The cylindrical portion 272 and upper electrode support 218 have a center gas feed or passageway 262 and one or more edge gas feeds or passageways 260 for providing various gases to be energized into a plasma in the vicinity of the bevel edge.

The gap drive assembly 224 includes: an upper gap drive plate 234 for supporting the adapter plate 236; two pairs of mounting blocks 232 secured to the upper gap drive plate 234 on opposite sides of cylindrical portion 272, each mounting block having a slanted (inclined) bottom surface with respect to the vertical axis of support 218 and portion 272; a sliding component 230 having block driving plates 233 in contact with the slanted bottom surfaces of the slide mounting blocks 232; an actuator 231 coupled to the sliding component 230; a motor 226; and a threaded rod 228 coupled to the motor 226 and actuator 231 and operative to convert a rotational motion of the motor 226 into a horizontal motion of the actuator 231 and sliding component 230. To move the upper electrode assembly 207 in the vertical direction, the motor 226 rotates the threaded rod 228, which in turn moves the block driving plates 233 relative to the slide mounting blocks 232 in the horizontal direction. As a result, the slide mounting blocks 232 move in the vertical direction due to their bottom surface inclination, and thereby the upper gap drive plate 234, adapter plate 236, planarity adjustment assembly 220, upper electrode support 218, and the upper electrode assembly 207 move as a unit in the vertical direction.

The upper metal component 208 includes a stepped hole coupled to the center gas feed 262 and an edge gas plenum 209 coupled to the edge gas feed 260. The upper dielectric plate 210 is attached to the electrically grounded upper metal component 208 and formed of a dielectric ceramic material such as alumina. The upper dielectric plate 210 may optionally have a coating of $Y_2O_3$. Typically, it is hard to drill a deep straight hole in some ceramics, such as $Al_2O_3$, and therefore a stepped hole 276 can be used instead of a deep straight hole. For brevity, the upper dielectric plate 210 is shown to have one center hole. However, the upper dielectric plate 210 may have any desired number of holes, e.g., a showerhead hole pattern. The upper dielectric plate 210 includes a gap sensor 274 for measuring the vertical gap between the upper and lower electrode assemblies 207, 211. A signal outputted from the gap sensor 274 is transmitted via suitable circuitry to a motor controller (not shown in FIG. 2) for controlling the motor 226 and thereby adjust the vertical gap. Other types of in-situ detector, such as laser, inductive, capacitive, acoustic, linear variable differential transformer (LVDT) sensor, can be used as a gap sensor and located either inside or outside the chamber wall 202, depending on the type of sensor.

The lower electrode assembly 211 may include: a powered electrode 212 coupled to an RF power source 261 for providing RF power during operation; a bottom dielectric ring 264 having upper and lower portions 264a, 264b for electrically isolating the powered electrode 212 from the bottom chamber wall 202b; and lift pins/pin operating unit (pin unit).

The center gas feed 262 and/or edge gas feed 260 is used to provide various gases into the space 286 inwardly of chamber wall 202. During operation, the plasma is formed around the bevel edge of the substrate 280 in a generally annular zone for wafer bevel edge cleaning. To prevent the plasma from reaching the central portion of the substrate 280, the process gas can be fed through the center gas feed 262. Then, the gas passes through the gap between the upper electrode assembly 207 and the substrate 280 radially across the substrate. When the edge gas and center gas feeds are used, each gas feed may provide the same process gas or other gases, such as buffer gas and purge gas. For instance, the buffer gas can be injected through the center gas feed 262, while the process gas can be injected through the edge gas feed 260. The plasma/process gas in the chamber space 286 is withdrawn through a plurality of holes 284 into a bottom space 282 and thence to a vacuum pump 268.

Figure 3:
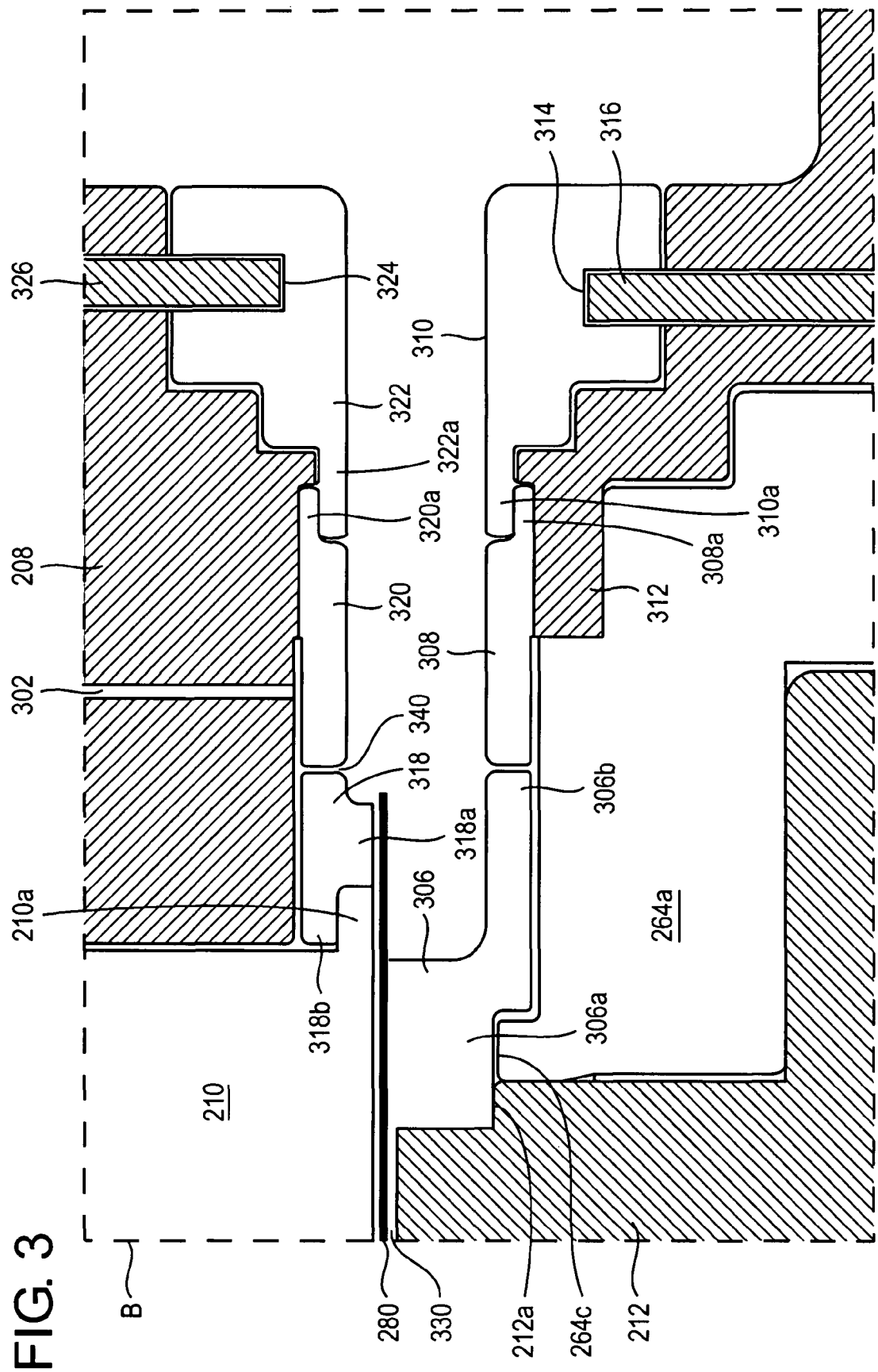
FIG. 3 shows an enlarged view of region B in FIG. 2.

FIG. 3 shows an enlarged schematic diagram of region B in FIG. 2. As depicted, the upper electrode assembly 207 includes three concentrically positioned rings: an inner upper configurable plasma exclusion zone (PEZ) ring 318; an intermediate upper electrode ring 320; and an outer upper dielectric ring 322. Hereinafter, the term PEZ refers to a radial distance from the center of the substrate to the outer edge of the area where the plasma for cleaning the bevel edge is excluded. The gap 340 between the upper configurable PEZ ring 318 and the upper electrode ring 320 forms a tortuous gas passageway which is connected to an edge gas passageway formed by through hole 302. The edge gas passageway 302 is coupled to the edge gas plenum 209 (FIG. 2). The tortuous gap 340 prevents the edge gas passageway 302 from being directly exposed to plasma thereby preventing formation of secondary plasma or plasma light-up within the edge gas passageway 302. The secondary plasma could otherwise erode the inner wall of the edge gas passageway 302 thereby requiring frequent replacement of the upper metal component 208 and introducing contaminants of the eroded material to the substrate 280.

The upper configurable PEZ ring 318 has an inner recess and an outer recess formed on opposite sides of a downwardly extending projection 318a, wherein the inner recess is used to mount the upper configurable PEZ ring 318 on the outer protrusion 210a of the upper dielectric plate 210. The upper PEZ ring 318 can have different configurations and provide different plasma exclusion zones above the substrate. The upper PEZ ring 318 can be replaced with a differently configured PEZ ring. Due to plasma erosion, the PEZ ring 318 also needs to be replaced more frequently than the other parts of the upper electrode assembly 207 and is thus a consumable component. Typically, process gases may include an oxygen-containing gas, such as $O_2$. Small amounts, such as <10% by volume, of a fluorine-containing gas, such as $CF_4$, $SF_6$, or $C_2F_6$, may also be added to clean the bevel edge. Plasma containing these reactive gases may erode the upper configurable PEZ ring 318, thus leading to frequent replacements of the upper configurable PEZ ring 318. For easy access to the upper configurable PEZ ring 318 during replacement, the upper configurable PEZ ring 318 is held in place by the upper dielectric plate 210 and can be replaced without removing other parts of the upper electrode assembly 207 from the chamber wall 202.

The upper configurable PEZ ring 318 preferably minimizes plasma erosion of the upper dielectric plate 210. The upper configurable PEZ ring 318 is preferably formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or the support ring 124 can be a composite ring of metal, ceramic or polymer coated with a conductive or dielectric material such as Si, SiC or $Y_2O_3$, e.g., ceramic (preferably $Al_2O_3$), or pure material, such as SiC, to reduce contamination of the substrate 280 during a bevel edge cleaning operation. The upper configurable PEZ ring 318 may also be formed of a material having a high electrical resistance, preferably, but not limited to, at least about ~105 ohm-cm. As the electrical coupling between the powered electrode 212 and the upper electrode ring 320 is affected by the electrical properties of the upper configurable PEZ ring 318, the plasma characteristics can be controlled by selection of the material for the upper configurable PEZ ring 318.

The upper electrode ring 320 is in contact with and grounded via the upper metal component 208. Instead of using fastening mechanisms, such as bolts, the upper electrode ring 320 is preferably held in place by the clamping force of the outer upper dielectric ring 322. For instance, an inwardly extending flange 322a on the ring 322 can fit under an outwardly extending flange 320a on ring 320. The upper electrode ring 320 may be formed of a metal, such as anodized aluminum. In cases where aluminum contamination is to avoided, the upper electrode ring 320 may be formed of pure Si, CVD SiC or any suitable high-purity conductive materials. The clamping arrangement provides advantages over a bolt-through design in that the clamping arrangement simplifies the cross sectional configuration of the upper electrode ring 320 and thereby lowers the Cost-of-Consumables (CoC) and allows the use of a wider range of materials for contamination control. The bottom surface of the upper electrode ring 320 is preferably offset vertically above the bottom surface of the upper dielectric plate 210. In a variation, the inner and outer edges of the upper electrode ring 320 may be expanded further outwardly and/or the bottom surface of the upper electrode ring 320 is flush with or positioned below the bottom surface of the plate 210.

The outer upper dielectric ring 322 is preferably formed of a dielectric material, such as $Al_2O_3$, and may be coated with $Y_2O_3$. The outer upper dielectric ring 322 includes circumferentially spaced apart threaded holes 324 to receive bolts 326 for securing the outer upper dielectric ring 322 to the upper metal component 208. The outer upper dielectric ring 322 includes a flange 322a that is used to clamp the upper electrode ring 320 to the upper metal component 208. It is noted that each bolt 326 is screwed from the top side of the upper electrode assembly 207 so that the bolts are not exposed to the plasma. The inner edge diameter of the outer upper dielectric ring 322 determines the outer diameter of the ring or donut shaped plasma for cleaning the bevel edge.

The lower electrode assembly 211 includes a lower metal collar 312 and three concentrically positioned rings: a lower configurable PEZ ring 306; a lower electrode ring or hoop ring 308; and an outer lower dielectric ring 310. The substrate 280 is mounted on the top surface of the lower configurable PEZ ring 306. The top surface of the powered electrode 212, the bottom surface of the substrate 280, and lower configurable PEZ ring 306 form a shallow vacuum region recess (vacuum region) 330, wherein a vacuum pump evacuates the vacuum region below the substrate. For example, lift pin holes in electrode 212 can be in communication with a vacuum pump. As such, the powered electrode 212 functions as a vacuum chuck for holding the substrate 280 in place during a cleaning operation.

The lower configurable PEZ ring 306, lower electrode ring 308, and lower metal collar 312 are supported by the bottom dielectric ring or focus ring 264 (more specifically, on the upper portion 264a of the bottom dielectric ring). The lower electrode ring 308 is clamped to the lower metal collar 312 by the outer lower dielectric ring 310, wherein the lower metal collar 312 is connected to the bottom chamber wall 202b for grounding. For example, an inwardly extending flange 310a on dielectric ring 310 can overlie and clamp against an outwardly extending flange 308a on the electrode ring 308. The focus ring 264 electrically isolates the powered electrode 212 from the lower electrode ring 308 and the lower metal collar 312. In the embodiment shown, collar 312 includes a stepped inner surface mating with focus ring 264a and a stepped outer surface mating with dielectric ring 310.

The powered electrode 212 is preferably formed of a metal, such as anodized aluminum. Without the PEZ ring 306, the powered electrode 212 could be exposed to and eroded by the plasma and, in cases where high cleanliness plasma is required, the electrode would be formed of expensive material to meet the cleanliness requirement. In contrast, as the lower configurable PEZ ring 306 shields the powered electrode 212 from the plasma, the powered electrode 212 can be formed of less costly electrode materials regardless of the cleanliness requirement.

The lower configurable PEZ ring 306 has inner and outer flanges 306a, 306b, the inner flange 306a is used to mount the lower configurable PEZ ring 306 on a recess on the outer upper edge of the powered electrode 212 and upper portion 264a of focus ring 264. The lower configurable PEZ ring 306 can be replaced with differently configured rings to provide different bottom plasma exclusion zones. The lower configurable PEZ ring 306 also may need to be replaced more frequently than the other parts of the lower electrode assembly 211 due to plasma erosion and can be considered as a consumable component. For easy access to the lower configurable PEZ ring 306 during replacement, the lower configurable PEZ ring 306 is preferably mounted with the flange 306a overlying upper surface 212a of the powered electrode 212 and upper surface 264c of the focus ring 264, and can be replaced without removing other parts of the lower electrode assembly 211 from the chamber wall 202.

The lower configurable PEZ ring 306 preferably minimizes the plasma from eroding the powered electrode 212. The lower configurable PEZ ring 306 is preferably formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or the support ring 124 can be a composite ring of metal, ceramic or polymer coated with a conductive or dielectric material such as Si, SiC or $Y_2O_3$, e.g., ceramic (preferably $Al_2O_3$), or pure material, such as CVD SiC, to reduce contamination of the substrate 280 during operation. The lower configurable PEZ ring 306 may also be formed of a material having a high electrical resistance, preferably, but not limited to, at least about ~105 ohm-cm. As the electrical coupling between the powered electrode 212 and the lower electrode ring 308 is affected by the electrical properties of the lower configurable PEZ ring 306, the plasma characteristics can be controlled by varying the material of the lower configurable PEZ ring 306.

The lower electrode ring 308 is connected to and grounded via the lower metal collar 312. Instead of using fastening mechanisms, such as bolts, the lower electrode ring 308 is preferably held in place by the clamping force of the outer lower dielectric ring 310. The lower electrode ring 308 can be formed of a metal, such as anodized aluminum. In cases where contamination of the substrate is to be minimized, the lower electrode ring 308 may be formed of pure Si, CVD SiC or any suitable high-purity conductive materials. The clamp-in-place design can simplify the cross sectional configuration of the lower electrode ring 308 thereby lowering the CoC and allow the use of a wider range of materials for contamination control.

The outer lower dielectric ring 310 is preferably formed of a dielectric material, such as $Al_2O_3$, and may be coated with $Y_2O_3$. The outer lower dielectric ring 310 includes threaded holes 314 to receive bolts 316 for securing the outer lower dielectric ring 310 to the lower metal liner 312. As discussed above, the outer lower dielectric ring 310 includes a flange that is used to clamp the lower electrode ring 308 to the lower metal collar 312.

Figure 4:
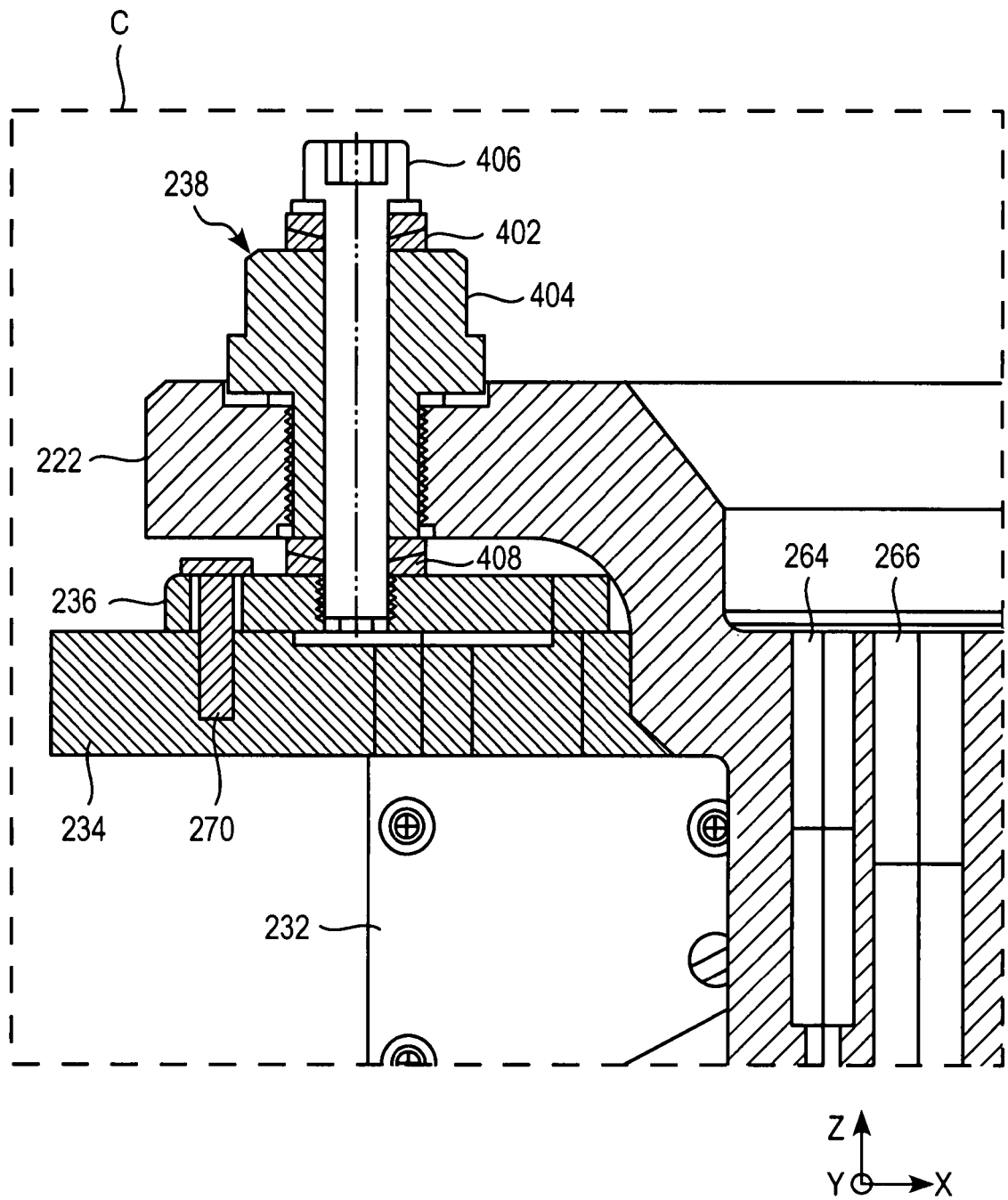
FIG. 4 shows an enlarged view of region C in FIG. 2.

FIG. 4 is an enlarged view of region C in FIG. 2. As depicted, the adapter plate 236 is disposed on the upper gap drive plate 234 and secured to the upper gap drive plate 234 by fasteners 270. To compensate for vertical axis misalignment between the upper and lower electrode assemblies 207, 211, the adapter plate 236 is float-mounted on the upper gap drive plate 234 with the fasteners 270 loose. Then, the adapter plate 236, which moves as one piece with the planarity adjustment assembly 220, upper electrode support 218, and upper electrode assembly 207, is moved in the x- and y-directions to align the upper electrode assembly 207 with the lower electrode assembly 211. Upon completion of the alignment, the adapter plate 236 is secured to the upper gap drive plate 234 by tightening the fasteners 270.

The bevel etcher 200 preferably includes, but is not limited to, three leveling screw assemblies 238. Each screw assembly 238 includes: a leveling screw 404 having threads engaged with the internal threads of the planarity plate 222 and a Vernier scale for precise reading of the turning angle of the screw; a lower spherical washer 408 for accommodating a tilted gap between the adapter plate 236 and planarity plate 222; a lock bolt 406 having threads engaged with the internal threads of the adapter plate 236; and an upper spherical washer 402 for accommodating a tilted gap between the leveling screw 404 and the lock bolt 406. To address the tilt angle of the upper electrode assembly 207 relative to the lower electrode assembly 211, the planarity plate 222 is mounted on the adapter plate 236 with the lock bolts 406 loose. Then, the three leveling screws 404 are turned to adjust the tilt angle. Subsequently, the lock bolts 406 are tightened to secure the planarity plate 222 to the adapter plate 236.

Figure 5:
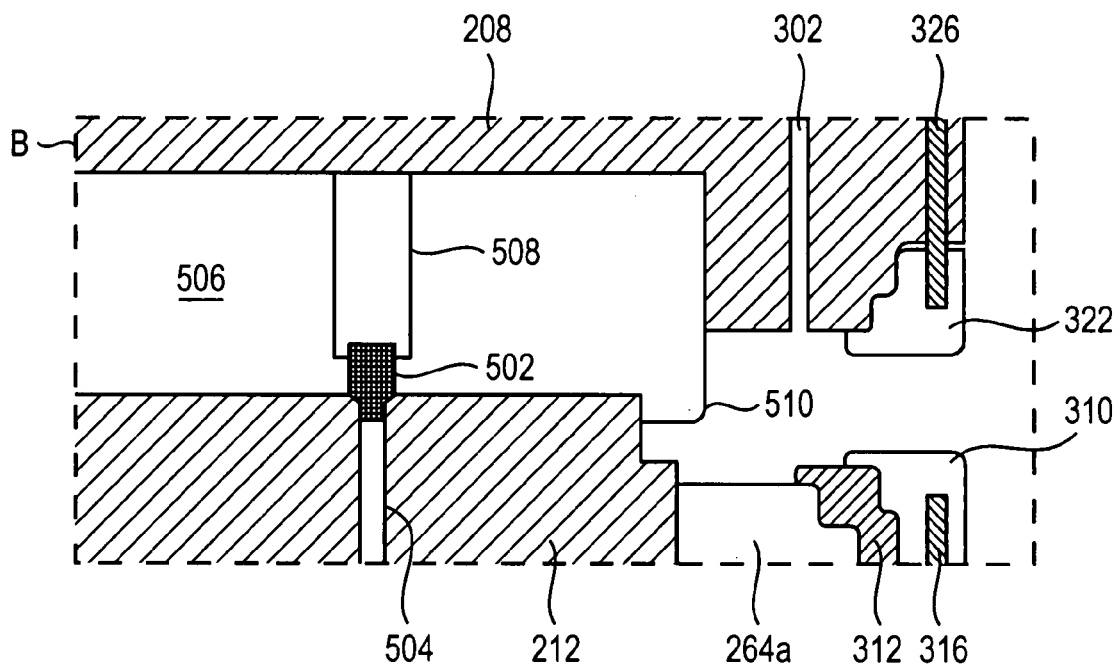
FIG. 5 shows an enlarged view of region B in FIG. 2, illustrating a centering fixture for aligning an upper electrode assembly with a lower electrode assembly.

FIG. 5 is an enlarged portion of region B in FIG. 2, illustrating a centering fixture 506 for aligning the upper electrode assembly 207 with the lower electrode assembly 211. During assembling the bevel etcher 200, the centering fixture 506 is used in place of the upper dielectric plate 210. Further detailed description of the steps to assemble the bevel etcher 200 is given in conjunction with FIG. 9. As depicted in FIG. 5, the centering fixture 506 includes an annular protrusion 510 formed around its bottom edge. The tolerance between the inner diameter of the ring-shaped protrusion 510 and the outer diameter of the powered electrode 212 is minimized to obtain a precise alignment of the upper electrode assembly with the lower electrode assembly 211 in the x- and y-directions. The outer diameter of the centering fixture 506 is the same as that of the upper dielectric plate 210 so that the centering fixture 506 is disposed in place of the upper dielectric plate 210 during assembling the bevel etcher 200.

The centering fixture 506 includes at least one stepped hole 508 to be aligned with the hole or path 504 so that the centering fixture 506 has a precise angular orientation along the z-axis relative to the lower electrode assembly 211. To align the hole 504 with the hole 508, a removable alignment pin 502 is inserted into the hole 508, wherein the bottom tip portion of the pin 502 extends into the top portion of the hole 504. As described in conjunction with FIG. 3, the lift pins move up and down through the holes 504, wherein each hole 504 functions as a gas passageway through which a vacuum pump evacuates the vacuum region 330. The powered electrode 212 operates as a vacuum chuck and holds the substrate 280 in place by the pressure difference between the top and bottom surfaces of the substrate 280 (FIG. 3). As a variation, the lower electrode assembly 211 can include an electrostatic chuck in place of a vacuum chuck. In this case, the electrostatic chuck is disposed at the location of the vacuum region 330 and holds the substrate in place during a cleaning operation.

Figure 6:
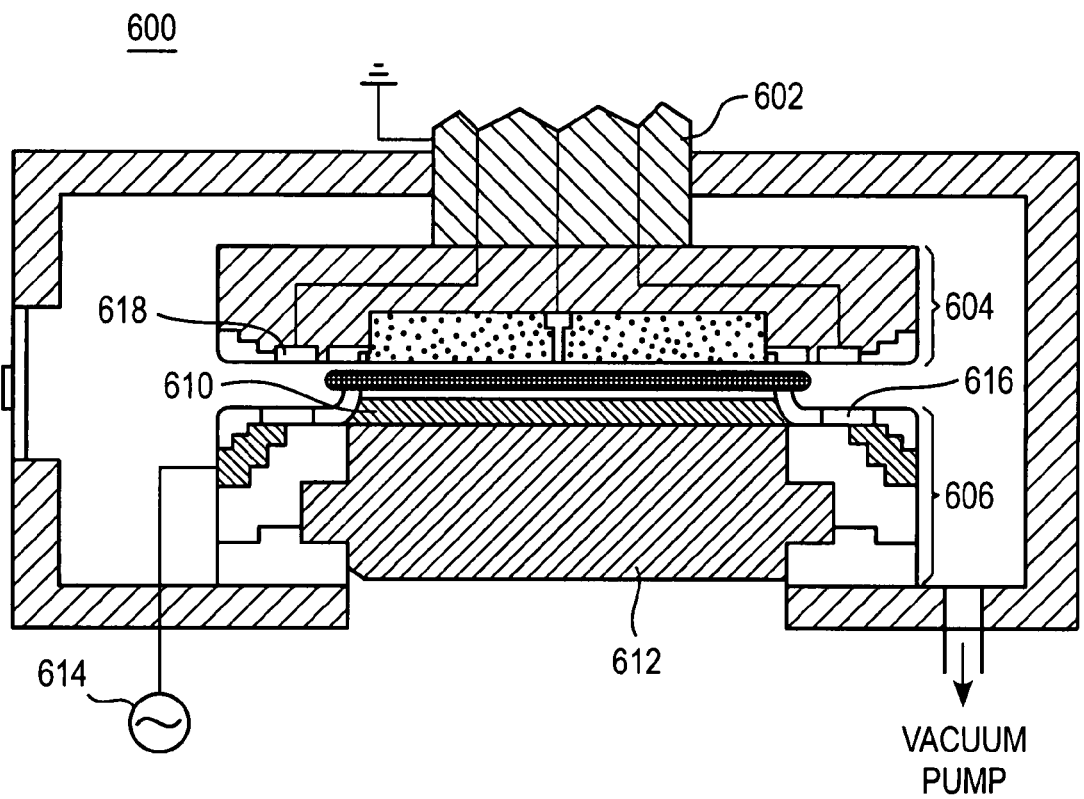
FIG. 6 shows a schematic cross sectional diagram of a bevel etcher in accordance with another embodiment.

FIG. 6 shows a schematic cross sectional diagram of a bevel etcher 600 in accordance with another embodiment. The components of the bevel etcher 600 are similar to those shown in FIG. 2. The difference is that the lower electrode assembly 606 includes: a substrate support 612; a dielectric plate or layer 610 disposed on the substrate support 612; and a lower electrode ring 616 coupled to an RF power source 614 for supplying RF power to energize the process gas into plasma for cleaning the bevel edge. The substrate support 612 can be formed of a conducting material or a dielectric material. The substrate support 612 operates as a vacuum chuck and includes a pin unit. For brevity, the pin unit is not shown in FIG. 6. As a variation, the bevel etcher 600 may include an electrostatic chuck disposed on the substrate support 612. In this embodiment, the upper electrode assembly 604 and upper electrode support 602 may be similar to the upper electrode assembly 207 and upper electrode support 218 in FIG. 2, respectively. In another variation, the upper electrode ring 618 may be coupled to an RF power source while the lower electrode ring 616 may be grounded.

The bevel etcher 600 includes a gap drive assembly, a planarity assembly, and metal bellows that are similar to those shown in FIG. 2. For brevity, these components are not shown in FIG. 6.

Figure 7:
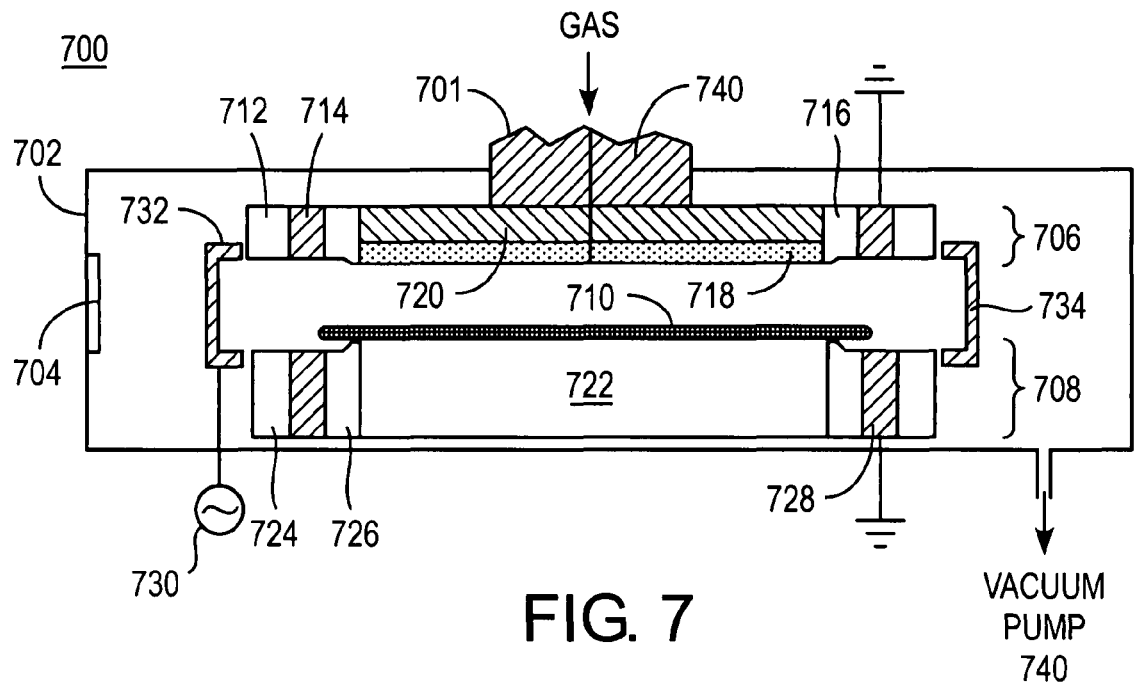
FIG. 7 shows a schematic cross sectional diagram of a bevel etcher in accordance with yet another embodiment.

FIG. 7 shows a schematic cross sectional diagram of a bevel etcher 700 in accordance with yet another embodiment. As depicted in FIG. 7, the bevel etcher 700 includes: a wall 702 having an opening or gate 704 through which a substrate 710 is loaded/unloaded; a substrate support 722 for supporting the substrate 710; an upper metal component 720; and a gas distribution plate 718 attached to the upper metal component 720 and coupled to a gas feed 740 and opposing the substrate support 722. The bevel etcher 700 also includes; a bottom edge electrode or bottom electrode ring 728 made of a conductive material, such as aluminum; a bottom dielectric ring 726; a top edge electrode or top electrode ring 714; a top dielectric ring 716; and a hollow cathode ring 732 for generating plasma to clean the bevel edge. The bottom dielectric ring 726 is interposed between the substrate support 722 and the bottom edge electrode 728 and electrically isolates the substrate support and the bottom edge electrode. Likewise, the top dielectric ring 716 is disposed between the gas distribution plate 718 and the top edge electrode 714 and electrically separates the gas distribution plate and the top edge electrode.

Beyond the top and bottom edge electrodes 714, 728, there are top and bottom insulating rings 712, 724, which are made of a dielectric material and respectively extend the surfaces of the top and bottom edge electrodes 714, 728 facing the substrate 710. The bottom dielectric ring 726 has, but is not limited to, a circular or a rectangular configuration when viewed from the top. Likewise, the outer edge of the substrate support 722, the bottom edge electrode 728, and bottom insulating ring 724 have, but are not limited to, circular or rectangular configurations when viewed from the top. Similarly, the top insulating ring 712, top edge electrode 714, top dielectric ring 716, and the outer edge of the gas distribution plate 718 have, but are not limited to, circular or rectangular configurations when viewed from the top. The gas distribution plate 718 is preferably formed of a dielectric material.

The top surface of the substrate support 722, the bottom surface of the substrate 710, and the top protrusion portion of the bottom dielectric ring 726 form an enclosed vacuum region that is similar to the vacuum region 330 (FIG. 3), wherein the substrate support 722 operates as a vacuum chuck. The substrate support 722 includes a pin unit as previously discussed. In a variation, the bevel etcher 700 may include an electrostatic chuck disposed on the substrate support 722. As another variation, the upper and lower electrode assemblies 706, 708 may be the same as those shown in FIG. 2. In still another variation, the substrate support 722 may be made of a conducting material with a dielectric layer formed on the top surface thereof. In yet another variation, the entire portion of the substrate support 722 may be formed of a dielectric material.

The hollow cathode ring 732, which is made of a conductive material, such as aluminum, is located outside the insulating rings 712, 724. The hollow cathode ring 732 has a channel 734 that faces the bevel edge. The width of the channel 734 is preferably greater than about 1.5 cm, for instance. It is noted that the hollow cathode ring 732 is moved in a vertical direction during loading/unloading the substrate 710 by a suitable device (not shown in FIG. 7).

The hollow cathode ring 732 is coupled to an RF power source 730 and both the top and bottom edge electrodes 714, 728 are grounded. The RF power source supplies RF power in a frequency range from ~2 MHz to ~13 MHz, for instance. In a variation, the top edge electrode 714 is coupled to an RF power source while the bottom edge electrode 728 and the hollow cathode ring 732 are grounded. In another variation, the bottom edge electrode 728 is coupled to an RF power source while the top edge electrode 714 and the hollow cathode ring 732 are grounded.

The capacitively coupled plasma can also be used to clean the interior of the chamber wall 702. To generate plasma for cleaning the interior, a high-frequency RF power, which has a frequency range from ~27 MHz to ~60 MHz, for instance, may be required. In a variation of the embodiment in FIG. 7, the top edge electrode 714 is coupled to a low-frequency (~2 MHz to ~13 MHz) RF power source while the bottom edge electrode 728 is coupled to a high-frequency RF power source and the hollow cathode ring 732 is grounded. In another variation, the top edge electrode 714 is coupled to a high-frequency RF power while the bottom edge electrode 728 is coupled to a low-frequency RF power source and the hollow cathode ring 732 is grounded. In yet another variation, the top edge electrode 714 and the hollow cathode ring 732 are grounded, while the bottom edge electrode 728 is coupled to both low- and high-frequency RF power sources.

It is noted that the bevel etcher 700 includes an upper electrode support 701, a gap drive assembly, a planarity adjustment assembly, and metal bellows that are similar to those in FIG. 2. For brevity, these components are not shown in FIG. 7.

Figure 8:
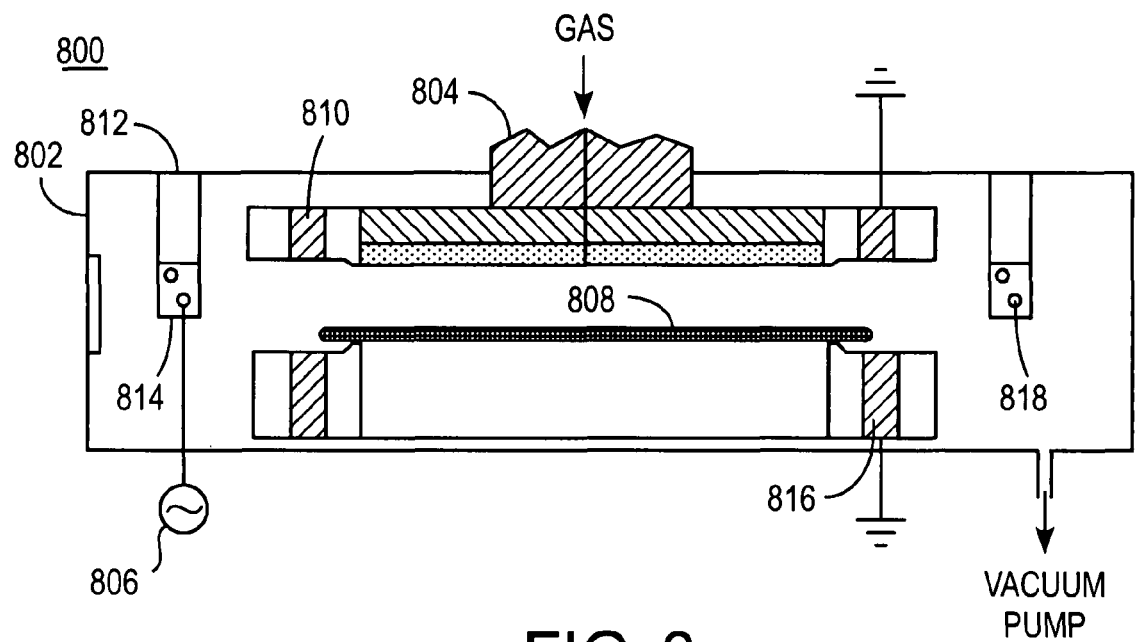
FIG. 8 shows a schematic cross sectional diagram of a bevel etcher in accordance with still another embodiment.

FIG. 8 shows a schematic cross sectional diagram of a bevel etcher 800 in accordance with another embodiment. The components of the bevel etcher 800 are similar to those in FIG. 7. One difference is that an inductive coil(s) 818 surrounds the substrate edge and the space between the top edge electrode 810 and the bottom edge electrode 816. The inductive coil 818 is embedded in a dielectric material 814 that is coupled to a dielectric support 812. The dielectric support 812 includes a suitable mechanism (not shown in FIG. 8) for moving the dielectric material 814 and coil 818 in the vertical direction during loading/unloading the substrate 808.

The inductive coil 818 is coupled to an RF power source 806. During the bevel edge cleaning process, the RF power source 806 supplies RF power in a range, but not limited to, from ~2 MHz to ~13 MHz to generate an inductive plasma near the substrate edge. The top edge electrode 810 and the bottom edge electrode 816 are grounded to provide a returning path for the inductive plasma. The inductive coil 818 provides cleaning plasma to clean the bevel edge. In a variation, the inductive coil 818 is also coupled to a high-frequency RF power source to generate plasma for cleaning the interior of the chamber wall 802.

It is noted that the bevel etcher 800 includes an upper electrode support 804, a gap drive assembly, a planarity adjustment assembly, and metal bellows that are similar to those in FIG. 2. For brevity, these components are not shown in FIG. 8. It is also noted that the bevel etcher 800 has variations that are similar to those of FIG. 7. For instance, the top and bottom edge electrodes 810, 816 can be used to generate plasma for cleaning the interior of the wall 802. The top edge electrode 810 can be coupled to a high-frequency (~27 MHz to ~60 MHz) RF power source while the bottom edge electrode 816 is grounded. In another instance, the top edge electrode 810 is grounded while the bottom edge electrode 816 is coupled to a high-frequency RF power source.

It is noted that the upper electrode support 218, gap drive assembly 224, and planarity adjustment assembly 220 in FIG. 2 can be used with other upper electrode assembly configurations insofar as the upper electrode assembly can be properly secured to the upper electrode support 218. It is also noted that the upper electrode support 218, planarity adjustment assembly 220, and upper electrode assembly 211 may have any suitable number of gas passageways or gas feeds formed therethrough.

Figure 9:
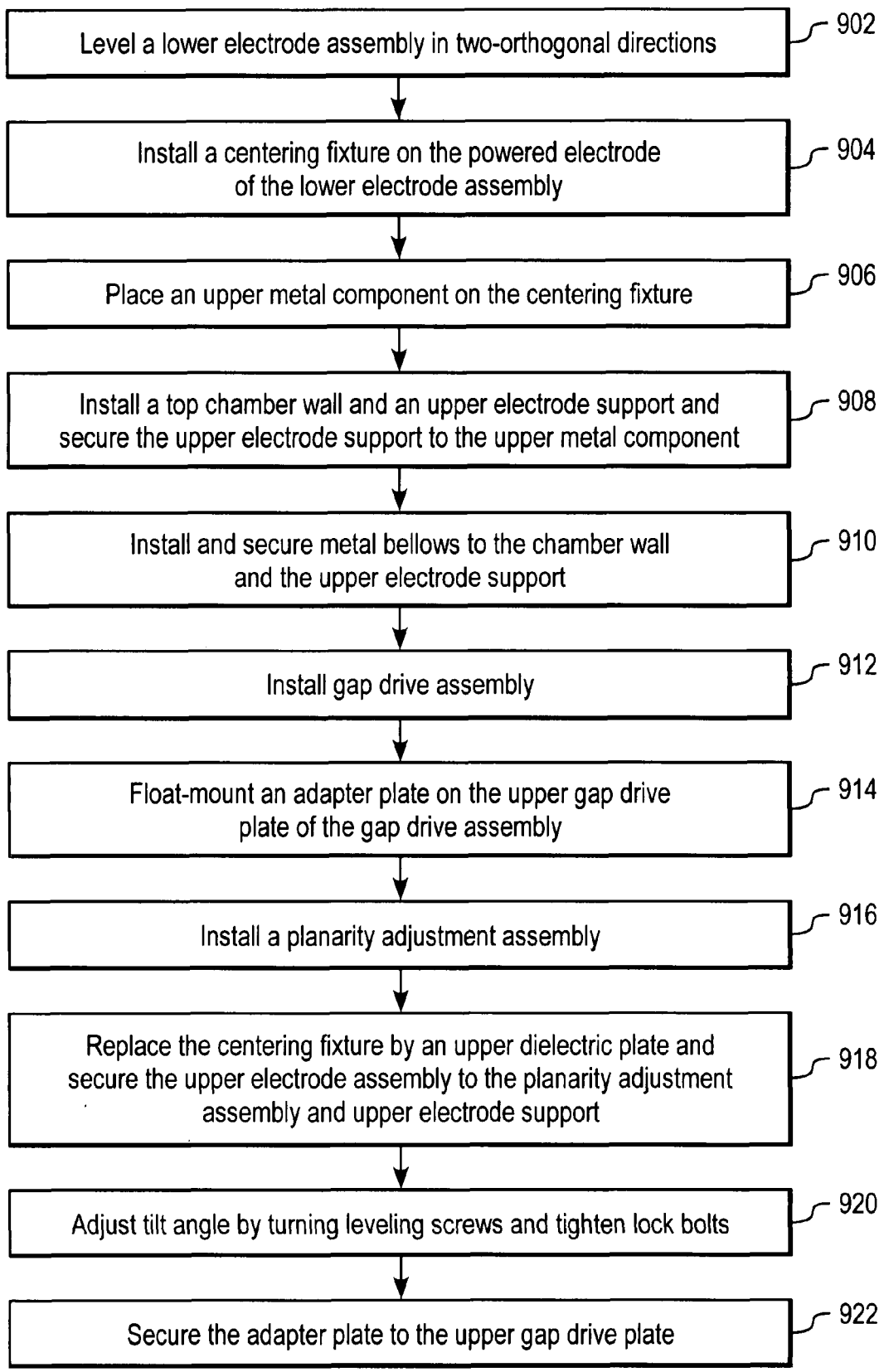
FIG. 9 shows a flow chart illustrating exemplary steps to assemble the bevel etcher in FIG. 2.

FIG. 9 shows a flow chart illustrating exemplary steps to assemble the bevel etcher 200. In step 902, the lower electrode assembly 211 is installed on the bottom chamber wall 202b and leveled in the x- and y-directions by a suitable leveling mechanism. Then, in step 904, the centering fixture 506 is installed on the powered electrode 212 of the lower electrode assembly 211. Next, the upper metal component 208 is placed on the centering fixture 506 in step 906. The upper electrode ring 320 can be clamped against metal component 208 by fitting its outer flange 320a over flange 322a on outer dielectric ring 322 and screwing bolts 326 into the outer dielectric ring 322 (FIGS. 3 and 5) and similarly lower electrode ring 308 can be clamped against metal liner 312 by fitting its outer flange 308a under flange 310a of the outer dielectric ring 310 and screwing bolts 316 into the outer dielectric ring 310. Subsequently, the top chamber wall 202a and upper electrode support 218 are installed in step 908. The upper electrode support 218 is aligned with the upper metal component 208 by one or more pins and secured to the upper metal component 208 by one or more fasteners (not shown in FIG. 2). In step 910, metal bellows 250 is attached to the top chamber wall 202a and upper electrode support 218. The metal bellows 250 forms a vacuum seal between the chamber wall 202a and upper electrode support 218 while allowing the upper electrode support 218 to have a vertical motion relative to the wall 202a. Then, in step 912, the gap drive assembly 224 is installed. Next, in step 914, the adapter plate 236 is installed or float-mounted on the upper gap drive plate 234 of the gap drive assembly with the fasteners 270 loose. In step 916, the planarity adjustment assembly 220 is installed. In this step, the cylindrical portion 272 of the planarity adjustment assembly 220 is aligned with upper electrode support 218 by one or more pins and secured to the upper electrode support 218 by one or more fasteners 266. The fasteners 270 are tightened to secure the adapter plate 236 to the upper gap drive plate 234. Also, the planarity plate 222 is disposed on the adapter plate 236 with lock bolts 406 (FIG. 4) loose. Next, in step 918, the centering fixture 506 is replaced by the upper dielectric plate 210. When dielectric plate 210 is installed, the inner PEZ ring is also installed by fitting flange 318b under flange 210a (FIG. 3) and one or more fasteners 266 are installed to secure the upper dielectric plate 210 to the upper electrode support 218. The fasteners 266 have threaded tips that engage with the threaded holes formed in the upper dielectric plate 210. As such, the fasteners 266 secure the planarity adjustment assembly 220 and upper electrode support 218 to the upper electrode assembly 207 so that the three components move as one piece. In step 920, the three leveling screws 404 are turned to adjust the tilt angle of the upper electrode assembly 207 relative to the lower electrode assembly 211. Upon completing the planarity adjustment, the lock bolts 406 are tightened to secure the planarity plate 222 to the adapter plate 236. Finally, in step 922, the fasteners 270 (located in holes in plate 236 which are wider than the bolt shafts) are tightened to secure the adapter plate 236 to the upper gap drive plate 234.

While the invention has been described in detail with reference to specific embodiments thereof, it will be apparent to those skilled in the art that various changes and modifications can be made, and equivalents employed, without departing from the scope of the appended claims.

What is claimed is:

1. A bevel etcher for plasma cleaning a semiconductor substrate, comprising:
a chamber having an interior in which a bevel edge of a semiconductor is plasma cleaned;
a lower electrode assembly having a top surface and adapted to support a substrate having a bevel edge;
an upper electrode assembly including a bottom surface that opposes and is in a spaced-apart relationship with the top surface to form a gap for receiving the substrate therein, the lower and upper electrode assemblies being operative to generate plasma for cleaning the bevel edge during operation; and
at least one mechanism supporting the upper electrode assembly, the lower electrode assembly, or both the upper electrode assembly and the lower electrode assembly and adapted to adjust the tilt angle, the horizontal translation, or both the tilt angle and the horizontal translation of the bottom surface relative to top surface;
wherein: (a) the lower electrode assembly includes an electrostatic chuck to clamp the substrate in place during operation and a support upon which the electrostatic chuck is disposed or (b) the etcher further comprises a chamber wall partially surrounding the lower and upper electrode assemblies, and metal bellows secured to the chamber wall and the mechanism and operative to form a vacuum seal therebetween while allowing the mechanism to move vertically relative to the chamber wall.

2. A bevel etcher as recited in claim 1, wherein the mechanism includes a planarity plate secured to the upper electrode assembly and a plurality of leveling screws, each leveling screw, when rotated, causing the planarity plate to tilt relative to the bottom electrode assembly such that the bottom surface tilts relative to the top surface.

3. A bevel etcher as recited in claim 2, wherein: (a) the mechanism includes an adapter plate secured to and disposed beneath the planarity plate and wherein the adapter plate is adapted to slide on a plane parallel to the top surface such that the upper electrode assembly is translated relative to the lower electrode assembly; or (b) a gap drive assembly is secured to the planarity plate and operative to move the planarity plate in a direction normal to the top surface thereby adjust the gap between the top and bottom surfaces in the direction.

4. A bevel etcher as recited in claim 3, wherein the gap drive assembly includes:
a plurality of slide mounting blocks secured to the planarity plate, each slide mounting block having a bottom surface inclined with respect to the direction;
a sliding component including a plurality of block driving plates having top surfaces along which the bottom surfaces are able to slide causing the mounting blocks to move in the direction;
a motor having an output shaft;
a threaded rod coupled to the output shaft; and
an actuator coupled to the threaded rod and the sliding component and operative to convert a rotational motion of the output shaft to a sliding motion of the sliding component thereby to effect motion of the planarity plate along the direction.

5. A bevel etcher as recited in claim 1, wherein the mechanism includes at least one process gas passage extending therethrough to the upper electrode assembly.

6. A bevel etcher as recited in claim 5, wherein the upper electrode assembly includes: an upper metal component secured to the mechanism; and an upper dielectric plate secured to and disposed beneath the upper metal component.

7. A bevel etcher as recited in claim 6, wherein: (a) the upper metal component and upper dielectric plate include at least one hole coupled to the process gas passage forming a gas outlet and wherein process gas is introduced to the gap through the gas outlet; or (b) the upper dielectric plate includes at least one gap sensor for measuring the vertical height of the gap.

8. A bevel etcher as recited in claim 7, wherein the gap sensor is one selected from the group consisting of inductive, laser, capacitive, acoustic, and linear variable differential transformer (LDVT) sensors.

9. A bevel etcher as recited in claim 1, wherein the lower electrode assembly includes a lower electrode ring surrounding the top surface and positioned therebeneath and the upper electrode assembly includes an upper electrode ring surrounding the bottom surface.

10. A bevel etcher as recited in claim 9, wherein: (a) one of the upper and lower electrode rings is grounded and the other is coupled to a radio frequency (RF) power source for supplying RF power to generate the plasma during operation; (b) a hollow cathode ring is disposed along the bevel edge, wherein one of the hollow cathode ring and the upper and lower electrode rings is coupled to a radio frequency (RF) power source for supplying RF power to generate the plasma and the others are grounded; or (c) an inductive coil is coupled to a radio frequency (RF) power source, concentrically surrounding the bevel edge, and operative to generate the plasma upon supply of RF power from the power source, wherein the upper and lower electrode rings are grounded.

11. A bevel etcher as recited in claim 1, wherein the bottom electrode assembly includes:
   a chuck body; and
   a dielectric ring surrounding the upper edge of the chuck body to form a vacuum region surrounded by the top surface of the chuck body and the dielectric ring, the dielectric ring being adapted to support the substrate such that the bottom surface of the substrate encloses the vacuum region;
   wherein the vacuum region is evacuated by a vacuum pump during operation to hold the substrate in place on the dielectric ring.

12. A bevel etcher as recited in claim 11, wherein: (a) a top portion of the chuck body is formed of a dielectric material; or (b) the upper and lower electrode rings are grounded and wherein the chuck body is of electrically conductive material coupled to a radio frequency (RF) power source for supplying RF power to generate the plasma during operation.

13. A bevel etcher as recited in claim 2, wherein the mechanism includes a planarity plate secured to the upper electrode assembly and an adapter plate secured to and disposed beneath the planarity plate and wherein the adapter plate is adapted to slide on a plane parallel to the top surface such that the upper electrode assembly is horizontally translated relative to the lower electrode assembly.

14. A bevel etcher as recited in claim 13, further comprising:
   a gap drive assembly secured to the planarity plate and operative to move the planarity plate in a vertical direction normal to the top surface so as to adjust a gap between the top and bottom surfaces in the vertical direction.

15. A bevel etcher as recited in claim 14, wherein the gap drive assembly includes:
   a plurality of slide mounting blocks secured to the planarity plate, each slide mounting block having a bottom surface angled with respect to the vertical direction;
   a sliding component including a plurality of block driving plates having top surfaces along which the bottom surfaces are able to slide causing the mounting blocks to move in the vertical direction;
   a motor having an output shaft;
   a threaded rod coupled to the output shaft; and
   an actuator coupled to the threaded rod and the sliding component and operative to convert a rotational motion of the output shaft to a sliding motion of the sliding component thereby to effect motion of the planarity plate along the vertical direction.

16. A method for assembling the bevel etcher according to claim 1, wherein the mechanism includes a plurality of leveling screws, comprising:
   leveling the lower electrode assembly;
   disposing the upper electrode assembly over the lower electrode assembly;
   securing the mechanism to the upper electrode assembly; and
   rotating at least one of the leveling screws to adjust the tilt angle of the bottom surface relative to the top surface.

17. A method as recited in claim 16, wherein the upper electrode assembly includes an upper metal component secured to the mechanism and an upper dielectric plate secured to and disposed beneath the upper metal component and wherein the step of disposing the upper electrode assembly includes:
   mounting a centering fixture on the lower electrode assembly; and
   mounting the upper metal component on the centering fixture, and wherein the step of securing the mechanism to the upper electrode assembly includes:
   disposing the mechanism on the upper metal component and securing the mechanism to the upper metal component to suspend the upper electrode assembly over the lower electrode assembly;
   removing the centering fixture; and
   securing the upper dielectric plate to the upper metal component.

18. A method of cleaning the bevel edge of a semiconductor substrate, comprising:
   loading a semiconductor substrate in the bevel etcher according to claim 1;
   injecting process gas into the gap between the top and bottom surfaces; and
   energizing the process gas into the plasma to clean the bevel edge of the substrate.

19. The method of claim 18, wherein the semiconductor substrate is one selected from the group consisting of a wafer, a flat panel display, or a circuit board.

* * * * *